US012586010B2

(12) United States Patent (10) Patent No.: US 12,586,010 B2
Takamatsu et al. (45) Date of Patent: Mar. 24, 2026

(54) WORKING PLAN ASSISTANCE DEVICE AND WORKING PLAN ASSISTANCE METHOD

(71) Applicant: KOBELCO CONSTRUCTION MACHINERY CO., LTD., Hiroshima (JP)

(72) Inventors: Nobuhiro Takamatsu, Hiroshima (JP); Satoshi Okada, Tokyo (JP)

(73) Assignee: KOBELCO CONSTRUCTION MACHINERY CO., LTD., Hiroshima (JP)

(*) Notice: Subject to any disclaimer, the term of this patent is extended or adjusted under 35 U.S.C. 154(b) by 41 days.

(21) Appl. No.: 18/691,777

(22) PCT Filed: Mar. 16, 2022

(86) PCT No.: PCT/JP2022/012015
§ 371 (c)(1),
(2) Date: Mar. 13, 2024

(87) PCT Pub. No.: WO2023/047655
PCT Pub. Date: Mar. 30, 2023

(65) Prior Publication Data
US 2024/0386340 A1 Nov. 21, 2024

(30) Foreign Application Priority Data
Sep. 27, 2021 (JP) ................................. 2021-156502

(51) Int. Cl.
*G06Q 10/0631* (2023.01)
*G06F 30/20* (2020.01)
(52) U.S. Cl.
CPC ....... *G06Q 10/06311* (2013.01); *G06F 30/20* (2020.01)

(58) Field of Classification Search
CPC ........ G06F 1/00–2123/00; G06Q 10/00–50/00
(Continued)

(56) References Cited

U.S. PATENT DOCUMENTS 10,007,351 B2 * 6/2018 Nagai ..................... G06F 3/013
10,822,208 B2 * 11/2020 Schoonmaker ....... B66C 23/905
(Continued)

FOREIGN PATENT DOCUMENTS

JP 2004-239050 A 8/2004
JP 2018-24500 A 2/2018
(Continued)

OTHER PUBLICATIONS

International Search Report Issued May 31, 2022, in PCT/JP2022/012015, filed on Mar. 16, 2022, 3 pages.

*Primary Examiner* — Alan S Miller
(74) *Attorney, Agent, or Firm* — Oblon, McClelland, Maier & Neustadt, L.L.P.

(57) ABSTRACT

A crane M (work machine) and a building Q (external structure) are modeled in a three-dimensional virtual space, and space occupation modes in the three-dimensional space are defined. Further, in the three-dimensional virtual space, a designated plane group configured with a plurality of designated planes $P_1$ and $P_2$ spaced apart from each other is defined along an upper revolving body and/or an attachment M1 which are revolvable with respect to a lower traveling body of a base body M0 of the crane M. One designated plane group is defined in accordance with an extension mode of the upper revolving body at one time point. Further, a second-order working plan assistance image, in which respective occupation modes of the crane M and the building Q in the designated planes $P_1$ and $P_2$ constituting the designated plane group are displayed, is output to a terminal output interface 22.

9 Claims, 7 Drawing Sheets

(58) Field of Classification Search
USPC ................................................. 705/7.11–7.42
See application file for complete search history.

(56) References Cited

U.S. PATENT DOCUMENTS

| | | | | |
|---|---|---|---|---|
| 10,875,177 | B2 * | 12/2020 | Wang ..................... | B25J 9/1653 |
| 12,208,996 | B2 * | 1/2025 | Yodawara ............... | B66C 13/40 |
| 2002/0186299 | A1 * | 12/2002 | Cofer ..................... | F16P 3/142 |
| | | | | 340/541 |
| 2012/0005103 | A1 * | 1/2012 | Seki ....................... | G06Q 10/04 |
| | | | | 705/301 |
| 2013/0013251 | A1 * | 1/2013 | Schoonmaker ......... | B66C 15/04 |
| | | | | 702/152 |
| 2013/0299440 | A1 * | 11/2013 | Hermann .............. | B66C 15/065 |
| | | | | 340/8.1 |
| 2018/0179029 | A1 * | 6/2018 | Schoonmaker ....... | B66C 23/905 |
| 2020/0101606 | A1 * | 4/2020 | Wang ................... | G05B 19/401 |
| 2021/0221654 | A1 * | 7/2021 | Yodawara ............. | B66C 13/40 |
| 2022/0404834 | A1 * | 12/2022 | Sasaoka ................. | B66C 13/48 |

FOREIGN PATENT DOCUMENTS

| | | | |
|---|---|---|---|
| JP | 2018-95370 | A | 6/2018 |
| JP | 2020-194426 | A | 12/2020 |
| JP | 2021-42045 | A | 3/2021 |
| JP | 2021-111110 | A | 8/2021 |
| WO | WO 2020/027335 | A1 | 2/2020 |

* cited by examiner

WORKING PLAN ASSISTANCE DEVICE AND WORKING PLAN ASSISTANCE METHOD

TECHNICAL FIELD

The present invention relates to a technique for assisting a working plan accompanying conveying work of a hoisted load by a crane.

BACKGROUND ART

A technique has been suggested in which after an operator inputs a hoisted load movement path by a touch screen procedure, a cross section formed along a telescopic boom is created based on a position of a hoisted load designated by the operator and is displayed on a monitor (for example, see Patent Literature 1). A cross section of a model image of an external structure, the cross section being formed in an axis direction of the telescopic boom in a case where the hoisted load is present at a point touched by the operator in a plan view, and a model image of a crane are displayed. Cross sections are successively switched and displayed in order of movement of the telescopic boom along an input movement path.

CITATION LIST

Patent Literature

Patent Literature 1
Japanese Patent No. 6805781, particularly paragraph 0059 and FIG. 8

SUMMARY OF INVENTION

Technical Problem

However, because an attachment (for example, a telescopic boom of a crane) of a work machine has a certain width, there are cases where a distance between one side of the attachment and an external structure is different from a distance between another side of the attachment and the external structure. Thus, in a case where only a cross section of a model image of the external structure and a model image of the work machine are displayed as in the related art, in view of the above difference between the distances, it might be difficult to estimate a possibility of interference between the attachment and the external structure.

Accordingly, an object of the present invention is to provide a device or the like that can aim at an improvement in precision of estimation about a possibility of interference between an attachment of a work machine and an external structure.

Solution to Problem

A working plan assistance device of the present invention causes an output interface to output a working plan assistance image in which respective occupation modes of an upper structure and a modeled building in each of a plurality of designated planes spaced apart from each other are displayed, the plurality of designated planes constituting a designated plane group defined in a front-rear direction of the upper structure, the upper structure being revolvable around a revolution axis line extending in a vertical direction to a lower structure in a work machine which is modeled in a three-dimensional virtual space.

According to the working plan assistance device in the above configuration, the work machine and an external structure are modeled in the three-dimensional virtual space, and space occupation modes in the three-dimensional space are defined. Further, in the three-dimensional virtual space, the designated plane group configured with the plurality of designated planes, which are spaced apart from each other, is defined in the front-rear direction of the upper structure provided to be revolvable around the revolution axis line with respect to the lower structure of the work machine. One designated plane group is defined in accordance with a revolving angle of the upper structure with respect to the lower structure at one time point and an extension mode, which corresponds to the revolving angle, in the front-rear direction. Further, the working plan assistance image, in which the respective occupation modes of the upper structure and the external structure in the designated planes constituting the designated plane group, is output to the output interface.

Thus, a user who accesses the working plan assistance image output to the output interface can be caused to estimate a level of a possibility of interference between the upper structure and the external structure in view of the respective occupation modes of the upper structure and the external structure in the designated planes. For example, even in a situation where it is estimated that the possibility of interference between the upper structure and the external structure is low in view of the respective occupation modes of the upper structure and the external structure in one designated plane, the user can be caused to estimate that the possibility of interference between the upper structure and the external structure is high in view of the respective occupation modes of the upper structure and the external structure in another designated plane. As a result, an improvement in the precision of estimation by the user about the possibility of interference between the upper structure of the work machine and the external structure can be aimed at.

DESCRIPTION OF EMBODIMENTS (Configuration)

Figure 1:
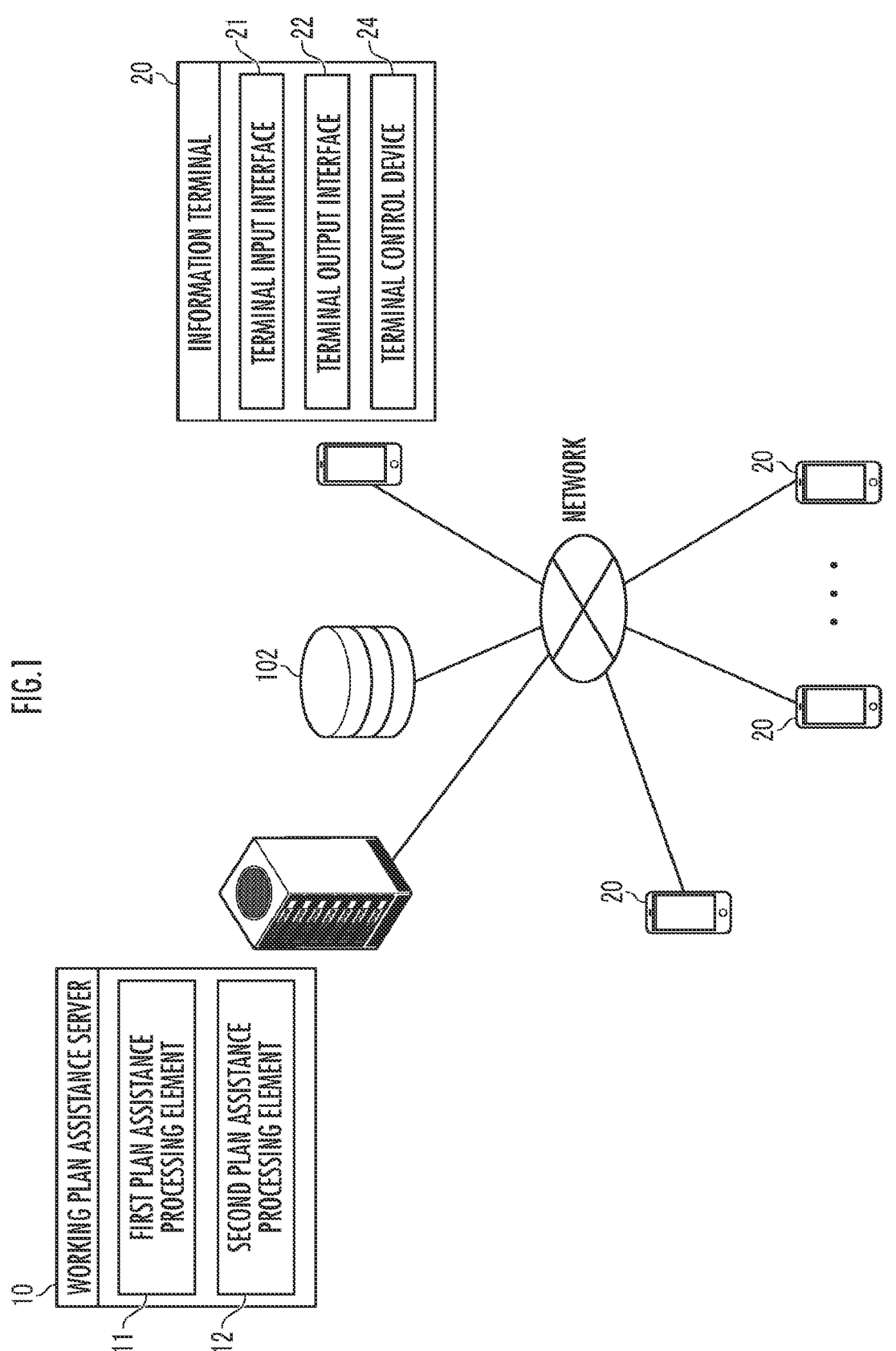
FIG. 1 is a configuration explanation diagram of a working plan assistance device as one embodiment of the present invention.

A working plan assistance device as one embodiment of the present invention, which is illustrated in FIG. 1, is configured with a working plan assistance server 10 which is capable of mutual communication with an information terminal 20 and a database server 102 via a network. The working plan assistance server 10 includes a first plan assistance processing element 11 and a second plan assistance processing element 12. Each of the first plan assistance processing element 11 and the second plan assistance processing element 12 is configured with an arithmetic processing device (such as a CPU or a processor core) and a storage device (a memory such as a ROM or a RAM). The arithmetic processing device is designed to read necessary data and/or a necessary program (software) from the storage device and to execute arithmetic processing, which follows the program and will be described later, for the data.

The database server 102 constitutes a database which stores and retains data needed by the information terminal 20 in a working plan such as data representing space occupation modes (such as sizes, positions, and postures) of a crane (work machine) and a building (external structure), the crane and the building being modeled in a three-dimensional virtual space. The database server 102 may be a configuration element of the working plan assistance server 10.

The information terminal 20 illustrated in FIG. 1 is configured with a smartphone, a tablet terminal, a personal computer, a beacon, or the like. As illustrated in FIG. 1, the information terminal 20 includes a terminal input interface 21 and a terminal output interface 22. The terminal input interface 21 is configured with capacitance type touch buttons or the like which constitute a touch screen. The terminal output interface 22 is configured with an image display device which constitutes the touch screen, an acoustic output device, and further a wireless communication apparatus. A designation signal is transmitted to an outside of the information terminal 20 by the wireless communication apparatus. A terminal control device 24 is configured with an arithmetic processing device (such as a CPU or a processor core) and a storage device (a memory such as a ROM or a RAM).

(Functions)

A description will be made about functions of a remote operation assistance system and an image-capturing function control system in the above configuration by using a flowchart illustrated in FIG. 2. In the flowchart, a block of "C." is used for simplifying descriptions, means transmission and/or reception of data, and means a conditional branch in which a process in a branching direction is executed while the transmission and/or reception of data is used as a condition.

Figure 2:
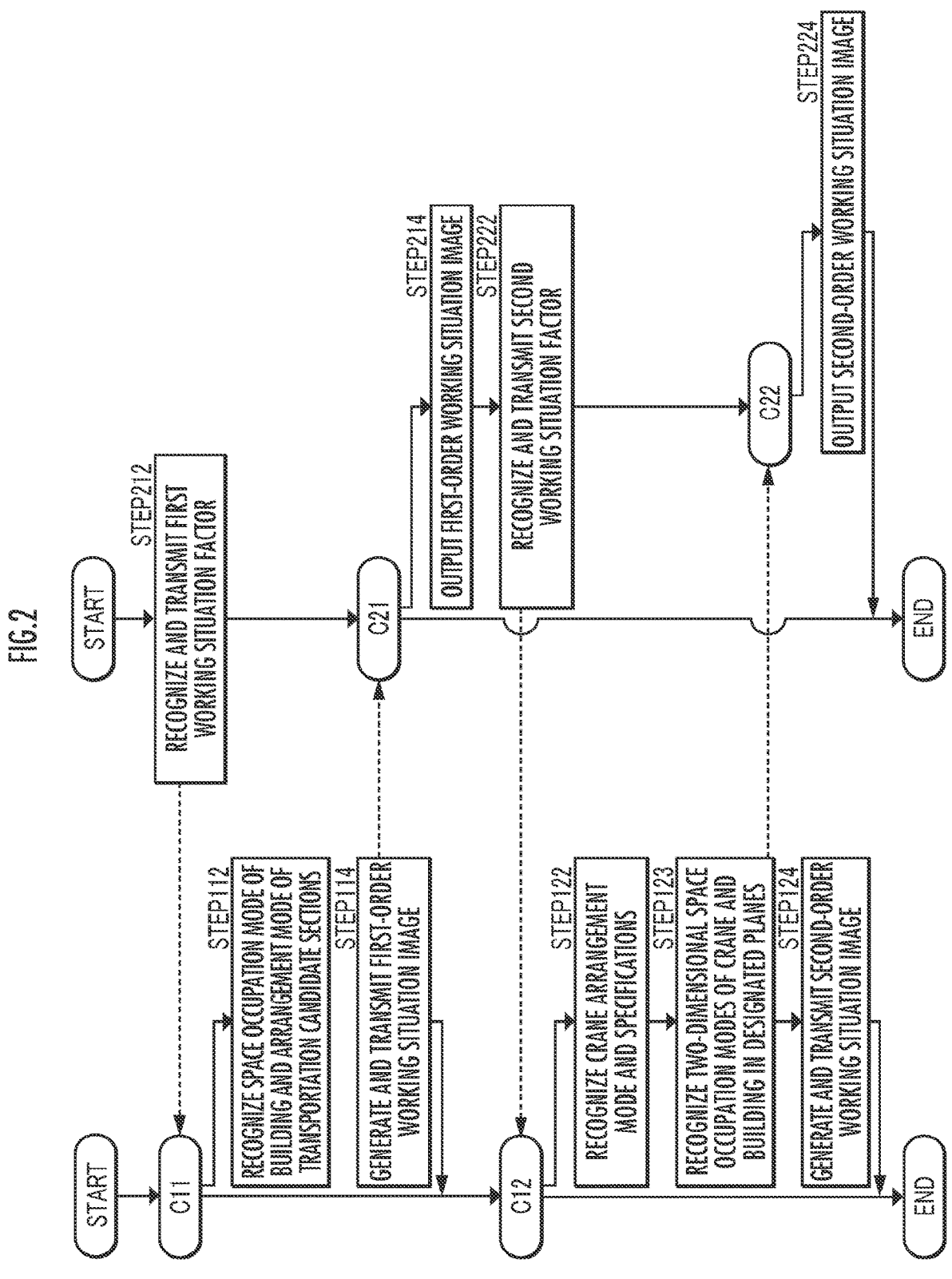
FIG. 2 is a flowchart illustrating functions of the working plan assistance device.

In the information terminal 20, a first working plan factor designated through the terminal input interface 21 is recognized by the terminal control device 24 and is transmitted to the working plan assistance server 10 (STEP 212 in FIG. 2). The "first working plan factor" is a factor for specifying a designated working situation model which is one working situation model among a plurality of different working situation models. The working situation model is defined by the space occupation mode of a building and an arrangement mode of a transportation candidate section in a virtual space. The working situation model may be defined by a landform of a section where a crane is possibly arranged around the building. The working situation model may be defined by the space occupation modes of vehicles and/or persons that come and go in a site. In this case, a terminal identifier for identifying the information terminal 20 is also transmitted to the working plan assistance server 10.

In a case where the first working plan factor is received in the working plan assistance server 10 (C21 in FIG. 2), the first plan assistance processing element 11 recognizes the designated working situation model corresponding to the first working plan factor and further the space occupation mode of the building and the arrangement mode of a plurality of transportation candidate sections in the virtual space, the space occupation mode and the arrangement mode defining the designated working situation model (STEP 112 in FIG. 2).

Figure 3:
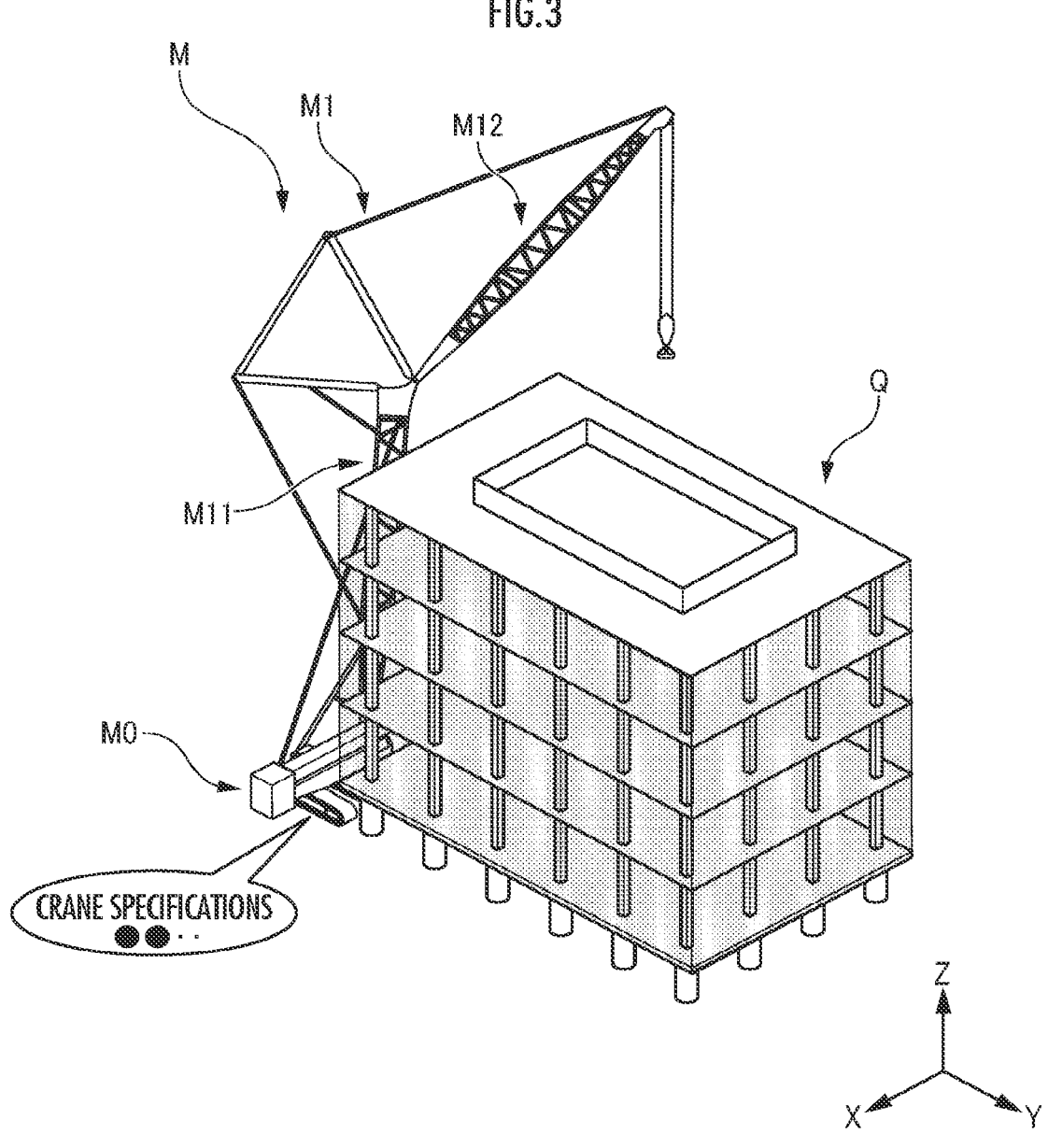
FIG. 3 is an explanation diagram about a first-order working plan assistance image.

As for the working situation model, for example, in a three-dimensional virtual space which is illustrated in FIG. 3 and is defined by a three-dimensional orthogonal coordinate system (X, Y, Z), the space occupation mode of a building Q (external structure) in a general rectangular cuboid shape is defined by a three-dimensional region $\{X, Y, Z | X_{Q1} \le X \le X_{Q2},\ f_{Q1}(X) \le Y \le f_{Q2}(Y),\ g_{Q1}(X,\ Y) \le Z \le g_{Q2}(X, Y)\}$ or the point group which expresses the contour of the three-dimensional region. Terms $f_{Q1}$ and $f_{Q2}$ represent functions (for example, linear functions) having a main variable X for defining a spreading mode of the building Q in a Y direction. Terms $g_{Q1}$ and $g_{Q2}$ represent functions having main variables X and Y for defining the spreading mode of the building Q in a Z direction.

Next, a first-order working plan assistance image which represents the space occupation mode of the building Q in the three-dimensional virtual space is generated by the first plan assistance processing element 11 and is transmitted to the information terminal 20 (STEP 114 in FIG. 2).

Figure 4:
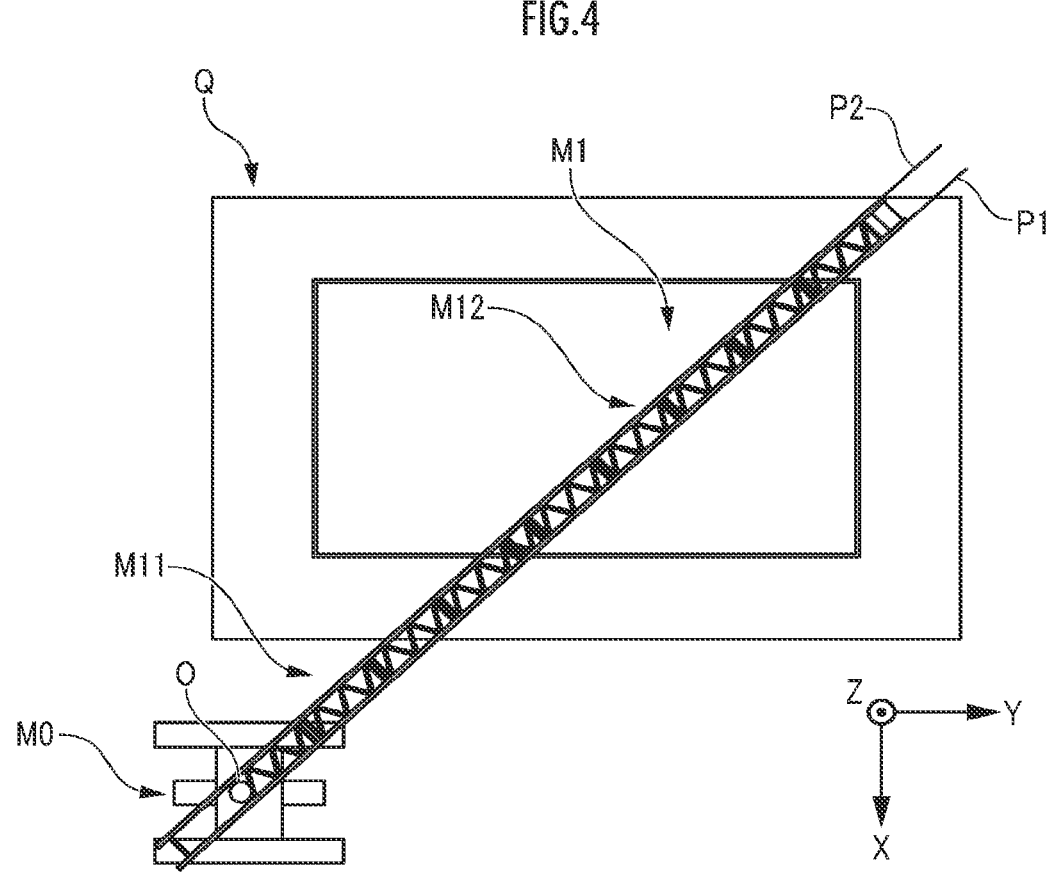
FIG. 4 is an explanation diagram about a method of defining designated planes.

In a case where the first-order working plan assistance image is received in the information terminal 20 (C21 in FIG. 2), the terminal control device 24 outputs the first-order working plan assistance image to the terminal output interface 22 (STEP 214 in FIG. 2). Accordingly, a perspective image illustrated in FIG. 3 and/or a bird's-eye image (except a crane M) illustrated in FIG. 4 are output to the terminal output interface 22 as the first-order working plan assistance images which represent the space occupation mode of the building Q in the virtual space.

In the information terminal 20, a second working plan factor designated through the terminal input interface 21 is recognized by the terminal control device 24 and is transmitted to the working plan assistance server 10 (STEP 222 in FIG. 2). The "second working plan factor" is a factor for designating the arrangement mode and specifications of the crane M (or its base body M0) in the virtual space, the arrangement mode and the specifications defining the working situation model. For example, coordinate values of the crane M around the building Q in the virtual space, a unit vector expressing a bearing of the crane M, the specifications, which include a rated total load of the crane M, a size of an attachment M1, and so forth, and so forth correspond to the second working plan factor. In this case, the terminal identifier for identifying the information terminal 20 is also transmitted to the working plan assistance server 10.

The base body M0 is configured with a lower traveling body which has a traveling function by continuous tracks or the like and an upper revolving body which is revolvable along a revolution axis line extending perpendicularly to the lower traveling body. The attachment M1 is provided to be capable of derricking relatively to the upper revolving body. The lower traveling body constituting the base body M0 corresponds to "lower structure", and the upper revolving body and/or the attachment M1 which also constitute the base body M0 correspond to "upper structure".

In a case where the second working plan factor is received in the working plan assistance server 10 (C22 in FIG. 2), the second plan assistance processing element 12 recognizes the arrangement mode of the crane M in the virtual space and the specifications of the crane M, the arrangement mode and the specifications corresponding to the second working plan factor (STEP 122 in FIG. 2).

Figure 5:
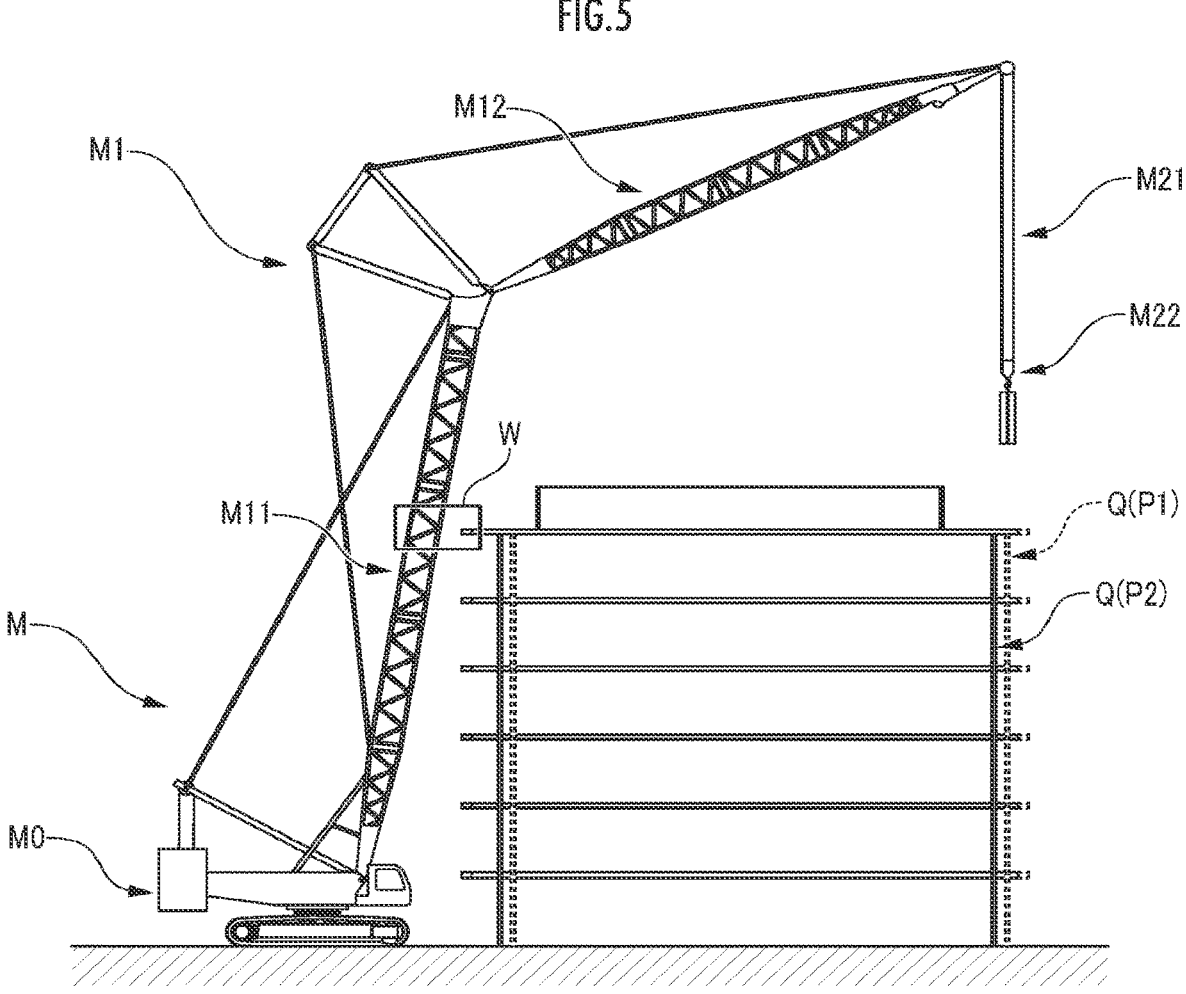
FIG. 5 is an explanation diagram about a second-order working plan assistance image which displays two-dimensional space occupation modes of a crane and a building in the designated planes.

For example, in the three-dimensional virtual space, a position and a bearing (a unit vector expressing the bearing) of the base body M0 as a configuration element of the crane M are recognized as the arrangement mode of the crane M. As illustrated in FIG. 5, a shape and a size of each of a boom M11 and a jib M12 which constitute the base body M0 and the attachment M1, permissible ranges of a revolving angle $\phi$ and an elevation angle $\theta 1$ of the boom M11, a permissible range of an elevation angle $\theta 2$ of the jib M12, a winding limit of a hook M22 suspended from the attachment M1 via a wire M21, and so forth are recognized as the specifications of the crane M. The hook M22 may include a main hook which is suspended from a distal end portion (for example, a boom-point sheave) of the boom M11 and/or an auxiliary hook which is suspended from a distal end portion (for example, a jib-point sheave) of the jib M12.

A permissible range (upper limit height and lower limit height) of a height above sea level of a highest reachable part of the crane M is fixed based on the permissible range of each of the elevation angles $\theta 1$ and $\theta 2$. However, in a case where structures of the cranes M are different, the permissible range (upper limit height and lower limit height) of the height above sea level of the highest reachable part of the crane M may be fixed based on a permissible range of a state quantity which fixes a position and/or a posture of a movable part of the crane M.

In the three-dimensional virtual space, external shapes of the modeled crane M and its configuration elements are simplified compared to the actual crane. For example, the base body M0 is defined as a rectangular cuboid, each of the boom M11 and the jib M12 is defined as a quadrangular prism or a circular column, the wire M12 is defined as a line, and the hook M22 is defined as a point. A shape and a size of the hook M22 may be defined so as to include a size of a material as a transportation target.

In the three-dimensional virtual space, the space occupation mode of the attachment M1 is defined by a three-dimensional region $\{X, Y, Z | X_{M11} \leq X \leq X_{M12}, f_{M11}(X) \leq Y \leq f_{M12}(Y), g_{M11}(X, Y) \leq Z \leq g_{M12}(X, Y)\}$. A term X represents functions of a posture (bearing angle) of the base body M0, the revolving angle $\phi$ and the elevation angle $\theta 1$ of the boom M11, and the elevation angle $\theta 2$ of the jib M12. Terms fun and $f_{M12}$ represent functions having a main variable X for defining the spreading mode of the attachment M1 in the Y direction. Terms $g_{M11}$ and $g_{M12}$ represent functions having main variables X and Y for defining the spreading mode of the attachment M1 in the 7, direction.

The second working plan factor is designated through the terminal input interface 21, and the cranes M with various specifications may thereby be selected. The crane M may be a mobile crane such as a crawler crane or a wheel crane (a crane traveling by tires, a rough terrain crane, a truck crane, or an all-terrain crane) or may be a fixed crane such as a jib crane, a climbing crane, or a tower crane. The crane M may be a tower crane, a luffing crane, or a fixed jib crane. The crane M may include a boom, a jib, a mast, and/or a strut as the attachment. The boom may be a TELESCO® (expanding and contracting) boom or a latticed boom.

Next, the second plan assistance processing element 12 recognizes a two-dimensional space occupation mode of each of the crane M or the attachment M1 as its configuration element and the building Q in each of a plurality of designated planes (STEP 123 in FIG. 2).

Specifically, first, a plurality of designated planes which are spaced apart from each other are defined or recognized along the attachment M1 extending from the base body M0 of the crane M modeled in the three-dimensional virtual space. The plurality of designated planes constitute one designated plane group. For example, as illustrated in FIG. 4, one pair of parallel designated planes $P_1$ and $P_2$ which are opposed to each other are defined so as to include or adjoin respective left and right side edge portions of the attachment M1. In the three-dimensional virtual space (X, Y, Z), for example, a first designated plane $P_1$ is defined by a relational expression $Y=aX+b_1$, and a second designated plane $P_2$ is defined by a relational expression $Y=aX+b_2$ ($b_2 \neq b_1$). As illustrated in FIG. 4, the first designated plane $P_1$ and the second designated plane $P_2$ are symmetrically arranged while a central plane passing through a center of the attachment M1 is set as a reference. The first designated plane $P_1$ and the second designated plane $P_2$ may be asymmetrically arranged while the central plane is set as the reference. The first designated plane $P_1$ and the second designated plane $P_2$ may be arranged in a non-parallel manner.

The first designated plane $P_1$ and/or the second designated plane $P_2$ may be defined to extend not along the attachment M1 but in a front-rear direction or a general front-rear direction (for example, a direction which is inclined leftward or rightward relatively to the front-rear direction in a range of $\pm 5°$ or smaller) along a left and/or right side edge of the upper revolving body and/or a counter weight which constitutes the base body M0.

Further, respective cross sections of the attachment M1 in the designated planes $P_1$ and $P_2$ and/or respective results of projection of the edge portions of the attachment M1 to the designated planes $P_1$ and $P_2$ in perpendicular directions of the designated planes are recognized as the respective two-dimensional space occupation modes of the attachment M1 in the designated planes $P_1$ and $P_2$. For example, the two-dimensional space occupation mode of the attachment M1 in the first designated plane $P_1$ is defined by relational expressions $f_{M11}(X) \leq Y=aX+b_1 \leq f_{M12}(Y)$ and $g_{M11}(X, Y) \leq Z \leq g_{M12}(X, Y)$. Similarly, the two-dimensional space occupation mode of the attachment M1 in the second designated plane $P_2$ is defined by relational expressions $f_{M11}(X) \leq Y=aX+b_2 \leq f_{M12}(Y)$ and $g_{M11}(X, Y) \leq Z \leq g_{M12}(X, Y)$.

In addition, respective cross sections of the building Q in the designated planes $P_1$ and $P_2$ are recognized as the respective two-dimensional space occupation modes of the building Q in the designated planes $P_1$ and $P_2$. For example, the two-dimensional space occupation mode of the building Q in the first designated plane $P_1$ is defined by relational expressions $f_{Q1}(X) \leq Y=aX+b_1 \leq f_{Q2}(Y)$ and $g_{Q1}(X, Y) \leq Z \leq g_{Q2}(X, Y)$. Similarly, the two-dimensional space occupation mode of the building Q in the second designated plane $P_2$ is defined by relational expressions $f_{Q1}(X) \leq Y=aX+b_2 \leq f_{Q2}(Y)$ and $g_{Q1}(X, Y) \leq Z \leq g_{Q2}(X, Y)$.

Further, a second-order working plan assistance image which displays the two-dimensional space occupation mode of each of the crane M or the attachment M1 as its configuration element and the building Q in each of a plurality of designated planes is generated by the second plan assistance processing element 12 and is transmitted to the information terminal 20 (STEP 124 in FIG. 2).

For example, the second-order working plan assistance image is generated in which one pair of designated planes $P_1$ and $P_2$ arranged in parallel are superimposed on each other in their perpendicular direction such that the respective two-dimensional space occupation modes of the crane M or at least the attachment M1 in the designated planes $P_1$ and $P_2$ are superimposed on each other. As illustrated in FIG. 4, based on the fact that a contour line (lower edge portion) of the building Q intersects with the attachment M1 in an inclined manner, as illustrated in FIG. 5, in the second-order working plan assistance image, a building $Q(P_2)$ in the second designated plane $P_2$ is shifted in a left direction, that is, in a direction approaching the crane M compared to the building $Q(P_1)$ in the first designated plane $P_1$. The second-order working plan assistance image may be generated in which one pair of designated planes $P_1$ and $P_2$ arranged in parallel are superimposed on each other in their perpendicular direction such that the respective two-dimensional space occupation modes of the crane M or at least the attachment M1 in the designated planes $P_1$ and $P_2$ are not exactly superimposed but are shifted from each other in a left-right direction.

Figure 6:
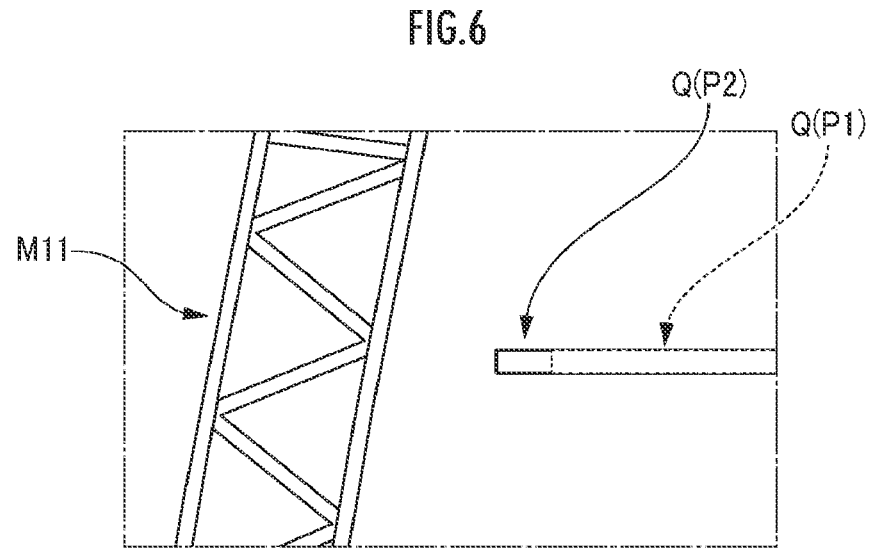
FIG. 6 is an enlarged diagram of a W section in FIG. 5.

Further, as illustrated in FIG. 6 as an enlarged diagram of a W portion in FIG. 5, the second-order working plan assistance image may be generated such that distances between the crane M or the attachment M1 and the buildings $Q(P_1)$ and $Q(P_2)$ are displayed in the second-order working plan assistance image.

In a case where the second-order working plan assistance image is received in the information terminal 20 (C22 in FIG. 2), the terminal control device 24 outputs the second-order working plan assistance image to the terminal output interface 22 (STEP 224 in FIG. 2). Accordingly, the second-order working plan assistance image illustrated in FIG. 5 and/or FIG. 6 is output to the terminal output interface 22.

Working and Effects

According to the working plan assistance server 10 (working plan assistance device) exhibiting the above functions, the crane M (work machine) and the building Q (external structure) are modeled in the three-dimensional virtual space, and the space occupation modes in the three-dimensional space are defined (see FIG. 3 and FIG. 4). Further, in the three-dimensional virtual space, a designated plane group configured with the plurality of designated planes $P_1$ and $P_2$, which are spaced apart from each other, is defined along the attachment M1 extending from the base body M0 of the crane M (see FIG. 4). One designated plane group is defined in accordance with an extension mode of the attachment M1 at one time point. Further, the second-order working plan assistance image which displays the respective occupation modes of the attachment and the building in the designated planes $P_1$ and $P_2$ constituting the designated plane group is output to the terminal output interface 22 (see FIG. 5 and FIG. 6).

Thus, a user who accesses the second-order working plan assistance image output to the terminal output interface 22 can be caused to estimate a level of a possibility of interference between the attachment M1 and the building Q in view of the respective occupation modes of the attachment M1 and the building Q in the designated planes $P_1$ and $P_2$. For example, even in a situation where it is estimated that the possibility of interference between the attachment M1 and the building Q is low in view of the respective occupation modes of the attachment M1 and the building Q in one designated plane $P_1$, the user can be caused to estimate that the possibility of interference between the attachment M1 and the building Q is high in view of the respective occupation modes of the attachment M1 and the building Q in the other designated plane $P_2$ (see FIG. 5 and FIG. 6). As a result, an improvement in precision of estimation by the user about the possibility of interference between the attachment M1 of the crane M and the building Q can be aimed at.

Further, the second-order working plan assistance image which displays the respective occupation modes of the attachment M1 and the building Q in each of the plurality of designated planes $P_1$ and $P_2$ such that the attachment M1 in each of the plurality of designated planes $P_1$ and $P_2$ is superimposed is output to the terminal output interface 22 (see FIG. 5). Accordingly, simultaneous estimation by the user about the possibility of interference between the attachment M1 of the crane M and the building Q in the designated planes $P_1$ and $P_2$ is facilitated. As a result, an improvement in the precision of estimation about the possibility of interference between the attachment M1 of the crane M and the building Q can be aimed at.

Other Embodiments of the Present Invention

In the above embodiment, the working plan assistance device is configured with the working plan assistance server 10, but as another embodiment, the working plan assistance device may be configured with the information terminal 20. That is, the first plan assistance processing element 11 and/or the second plan assistance processing element 12 may be configured with the terminal control device 24.

The second-order working plan assistance image, in which the occupation modes (for example, $Q(P_2)$) of the attachment M1 and the building Q in one designated plane (for example, the second designated plane $P_2$) where the distance between the attachment M1 and the building Q is shortest among a plurality of designated planes is displayed in a different mode from the occupation modes (for example, $Q(P_1)$) of the attachment M1 and the building Q in another designated plane (for example, the first designated plane $P_1$), may be output to the terminal output interface 22 (see FIG. 5 and FIG. 6).

According to the working plan assistance device in the above configuration, an improvement in easiness in visual recognition of the occupation modes of the attachment M1 and the building Q in one designated plane $P_2$, the designated plane $P_2$ being optimal for estimating the possibility of interference between the attachment M1 and the building Q in view of the distance between the attachment M1 and the building Q, is aimed at. As a result, an improvement in the precision of estimation about the possibility of interference between the attachment M1 of the crane M and the building Q can be aimed at.

The second-order working plan assistance image, in which the occupation modes (for example, $Q(P_2)$) of the attachment M1 and the building (in one designated plane present at an end with respect to a direction in which the attachment M1 revolves around the revolution axis line in the base body M0 (for example, the second designated plane $P_2$ in a case where the attachment M1 revolves counterclockwise in FIG. 4) among a plurality of designated planes is displayed in a different mode from the occupation modes (for example, $Q(P_1)$) of the attachment M1 and the building Q in another designated plane (for example, the first designated plane $P_1$), may be output to the terminal output interface 22.

According to the working plan assistance device in the above configuration, an improvement in easiness in visual recognition of the occupation modes of the attachment M1 and the building Q in one designated plane, the one designated plane being optimal for the user to estimate the possibility of subsequent interference between the attachment M1 and the building Q in view of a revolving direction of the attachment M1 of the crane M, is aimed at. As a result, an improvement in the precision of estimation about the possibility of interference between the attachment M1 of the crane M and the building Q can be aimed at.

A plurality of second-order working plan assistance image groups, in which the respective occupation modes of the attachment M1 and the building Q in each of a plurality of designated planes are displayed, the plurality of designated planes constituting each of a plurality of designated plane groups, the plurality of designated plane groups corresponding to a time series of the space occupation mode of the attachment M1 in the three-dimensional virtual space, may sequentially or simultaneously be output to the terminal output interface 22.

According to the working plan assistance device in the above configuration, the user, who accesses the plurality of second-order working plan assistance image groups which are sequentially or simultaneously output to the terminal output interface 22 and which each correspond to a plurality of time points, can be caused to estimate the level of the possibility of interference between the attachment M1 and the building Q in each of the designated planes, the designated planes constituting each of the second-order working plan assistance image groups. As a result, an improvement in the precision of estimation by the user about the possibility of interference between the attachment M1 of the crane M and the building Q can be aimed at.

Figures 7A, 7B:
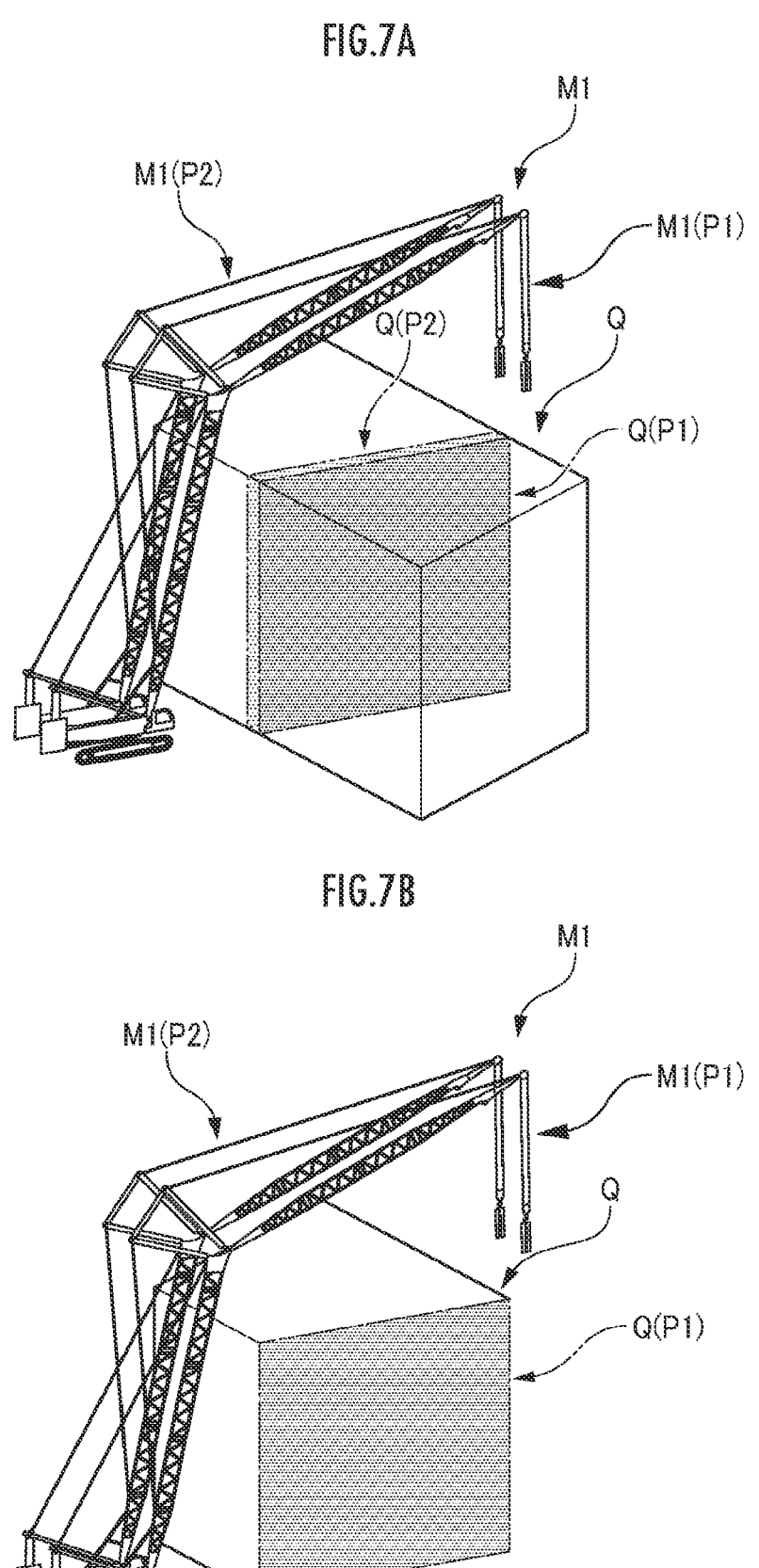
FIG. 7A is an explanation diagram about a first modification of the second-order working plan assistance image.
FIG. 7B is an explanation diagram about a second modification of the second-order working plan assistance image.

The second-order working plan assistance image, in which the respective occupation modes of the attachment M1 and the building Q in each of a plurality of designated planes are displayed together with the respective occupation modes of the attachment M1 and the building Q in the three-dimensional virtual space, may be output to the terminal output interface 22. For example, as illustrated in FIG. 7A, the second-order working plan assistance image, in which the respective space occupation modes of the modeled attachment M1 and the modeled building Q and the respective occupation modes of the attachment M1 and the building Q in each of one pair of designated planes $P_1$ and $P_2$ are displayed like a perspective view in the three-dimensional virtual space, may be output to the terminal output interface 22. A viewpoint and a sight direction which define the perspective view of the attachment M1 and the building Q may optionally be changed by the user through the terminal input interface 21.

According to the working plan assistance device in the above configuration, the user who accesses the working plan assistance image output to the terminal output interface 22 can be caused to recognize respective solid space occupation modes of the attachment M1 and the building Q, which are modeled in the three-dimensional virtual space, in addition to the respective occupation modes of the attachment M1 and the building Q in the designated planes $P_1$ and $P_2$. That is, the user can be caused to recognize three-dimensional space occupation modes or expansion modes of the attachment M1 and the building Q in addition to two-dimensional space occupation modes of the attachment M1 of the crane M and the building Q in the designated planes $P_1$ and $P_2$. As a result, an improvement in the precision of estimation by the user about the possibility of interference between the attachment M1 of the crane M and the building Q can be aimed at.

The second-order working plan assistance image, in which the respective occupation modes of the attachment M1 and the building Q in each of a plurality of designated planes are displayed as respective cross sections of the attachment M1 and the building Q which are divided by the designated plane in the three-dimensional virtual space, may be output to the terminal output interface 22. For example, as illustrated in FIG. 7B, the second-order working plan assistance image, in which the respective space occupation modes of the modeled attachment M1 and the modeled building Q are displayed as the respective cross sections of the attachment M1 and the building Q which are divided by one (for example, the first designated plane $P_1$) of one pair of designated planes $P_1$ and $P_2$, may be output to the terminal output interface 22. The viewpoint and the sight direction which define the perspective view of the attachment M1 and the building Q may optionally be changed by the user through the terminal input interface 21.

According to the working plan assistance device in the above configuration, the two-dimensional space occupation modes of the attachment M1 of the crane M and the building Q in each of the designated planes are provided as cross sections of solid objects corresponding to the attachment M1 and the building Q in the three-dimensional virtual space, and an improvement in easiness in visual recognition by the user is thereby aimed at. As a result, an improvement in the precision of estimation by the user about the possibility of interference between the attachment M1 of the crane M and the building Q can be aimed at.

The second-order working plan assistance image, in which the space occupation mode, in the three-dimensional virtual space, of a portion is represented, the portion being present in a displacement direction of the attachment M1 around the revolution axis line in the base body while the designated plane is set as a reference, may be output to the terminal output interface 22. For example, in a case where the attachment M1 revolves counterclockwise in FIG. 4, as illustrated in FIG. 7B, the second-order working plan assistance image, in which the space occupation modes of portions of the attachment M1 and the building Q are displayed, the portions being present in the revolving direction, the portions being divided by one (for example, the first designated plane $P_1$) of one pair of designated planes $P_1$ and $P_2$, may be output to the terminal output interface 22.

According to the working plan assistance device in the above configuration, an improvement in easiness in visual recognition of the three-dimensional space occupation modes of parts of solid objects, the parts of the solid objects being optimal for estimating the possibility of subsequent interference between the attachment M1 and the building Q in view of the revolving direction of the attachment M1 of the crane M, is aimed at. As a result, an improvement in the precision of estimation by the user about the possibility of interference between the attachment M1 of the crane M and the building Q in view of the revolving direction of the attachment M1 of the crane M can be aimed at.

In the working plan assistance device in the above configuration, the working plan assistance device preferably causes the output interface to output the working plan assistance image in which the occupation modes of the upper structure and the building in one designated plane where a distance between the upper structure and the building is shortest among the plurality of designated planes are displayed in a different mode from the occupation modes of the upper structure and the building in another designated plane.

According to the working plan assistance device in the above configuration, an improvement in easiness in visual recognition of the occupation modes of the upper structure and the external structure in one designated plane, the one designated plane being optimal for estimating the possibility of interference between the upper structure and the external structure in view of a distance between the upper structure and the external structure, is aimed at. As a result, an improvement in the precision of estimation about the possibility of interference between the upper structure of the work machine and the external structure can be aimed at.

In the working plan assistance device in the above configuration, the working plan assistance device preferably causes the output interface to output the working plan assistance image in which the occupation modes of the upper structure and the building in one designated plane among the plurality of designated planes, the one designated plane being present at an end with respect to a direction in which the upper structure revolves, are displayed in a different mode from the occupation modes of the upper structure and the building in another designated plane.

According to the working plan assistance device in the above configuration, an improvement in easiness in visual recognition of the occupation modes of the upper structure and the external structure in one designated plane, the one designated plane being optimal for the user to estimate the possibility of subsequent interference between the upper structure and the external structure in view of the revolving direction of the upper structure of the work machine, is aimed at. As a result, an improvement in the precision of estimation about the possibility of interference between the upper structure of the work machine and the external structure can be aimed at.

In the working plan assistance device in the above configuration, the working plan assistance device preferably causes the output interface to output the working plan assistance image in which the respective occupation modes of the upper structure and the building in each of the plurality of designated planes are displayed such that the upper structure in each of the plurality of designated planes is superimposed.

According to the working plan assistance device in the above configuration, simultaneous estimation by the user about the possibility of interference between the upper structure of the work machine and the external structure in the designated planes is facilitated. As a result, an improvement in the precision of estimation about the possibility of interference between the upper structure of the work machine and the external structure can be aimed at.

In the working plan assistance device in the above configuration, the working plan assistance device preferably causes the output interface to sequentially or simultaneously output a plurality of working plan assistance image groups in which the respective occupation modes of the upper structure and the building in each of the plurality of designated planes are displayed, the plurality of designated planes constituting each of a plurality of the designated plane groups, the plurality of the designated plane groups corresponding to a time series of a space occupation mode of the upper structure in the three-dimensional virtual space.

According to the working plan assistance device in the above configuration, the user, who accesses the plurality of working plan assistance image groups which are sequentially or simultaneously output to the output interface and which each correspond to a plurality of time points, can be caused to estimate the level of the possibility of interference between the upper structure and the external structure in each of the designated planes, the designated planes constituting each of the working plan assistance image groups. As a result, an improvement in the precision of estimation by the user about the possibility of interference between the upper structure of the work machine and the external structure can be aimed at.

In the working plan assistance device in the above configuration, the working plan assistance device preferably causes the output interface to output the working plan assistance image in which the respective occupation modes of the upper structure and the building in each of the plurality of designated planes are displayed together with the respective occupation modes of the upper structure and the building in the three-dimensional virtual space.

According to the working plan assistance device in the above configuration, the user who accesses the working plan assistance image output to the output interface can be caused to recognize respective solid space occupation modes of the upper structure and the external structure, which are modeled in the three-dimensional virtual space, in addition to the respective occupation modes of the upper structure and the external structure in the designated planes. That is, the user can be caused to recognize three-dimensional space occupation modes or expansion modes of the upper structure and the external structure in addition to two-dimensional space occupation modes of the upper structure of the work machine and the external structure in the designated planes. As a result, an improvement in the precision of estimation by the user about the possibility of interference between the upper structure of the work machine and the external structure can be aimed at.

In the working plan assistance device in the above configuration, the working plan assistance device preferably causes the output interface to output the working plan assistance image in which the respective occupation modes of the upper structure and the building in each of the plurality of designated planes are displayed as respective cross sections of the upper structure and the building which are divided by the designated plane in the three-dimensional virtual space.

According to the working plan assistance device in the above configuration, the two-dimensional space occupation modes of the upper structure of the work machine and the external structure in each of the designated planes are provided as cross sections of solid objects corresponding to the upper structure and the external structure in the three-dimensional virtual space, and an improvement in easiness in visual recognition by the user is thereby aimed at. As a result, an improvement in the precision of estimation by the user about the possibility of interference between the upper structure of the work machine and the external structure can be aimed at.

In the working plan assistance device in the above configuration, the working plan assistance device preferably causes the output interface to output the working plan assistance image in which a space occupation mode, in the three-dimensional virtual space, of a portion is represented, the portion being present in a displacement direction of the upper structure around the revolution axis line while the designated plane is set as a reference.

According to the working plan assistance device in the above configuration, an improvement in easiness in visual recognition of the three-dimensional space occupation modes of parts of solid objects, the parts of the solid objects being optimal for estimating the possibility of subsequent interference between the upper structure and the external structure in view of the revolving direction of the upper structure with respect to the lower structure in the work machine, is aimed at. As a result, an improvement in the precision of estimation by the user about the possibility of interference between the upper structure of the work machine and the external structure in view of the revolving direction of the upper structure of the work machine can be aimed at.

REFERENCE SIGNS LIST

10 working plan assistance server (working plan assistance device), 11 first plan assistance processing element, 12 second plan assistance processing element, 20 information terminal, 21 terminal input interface, 22 terminal output interface, An arrangement candidate section, Bm arrangement candidate section, M crane, M0 base body, M1 attachment, M11 boom, M12 jib, M21 wire, M22 hook

The invention claimed is:

1. A working plan assistance device, comprising:
a server and a terminal comprising circuitry configured to cause an output interface to output a working plan assistance image in which respective occupation modes of an upper structure of a crane and a modeled building in each of a plurality of designated planes spaced apart from each other are displayed, the plurality of designated planes constituting a designated plane group defined in a front-rear direction of the upper structure, the designated plane group being perpendicular to a width direction of an attachment of the crane, the attachment being configured to derrick relative to the upper structure, the upper structure being revolvable around a revolution axis line extending in a vertical direction to a lower structure in the crane which is modeled in a three-dimensional virtual space, wherein
a posture of the designated plane group changes according to a revolution of the upper structure such that a precision of estimation of interference between the upper structure of the crane and the building is improved based on the respective occupation modes of the upper structure and the building in the plurality of designated planes.

2. The working plan assistance device according to claim 1, wherein
the circuitry is configured to cause the output interface to output the working plan assistance image in which the occupation modes of the upper structure and the building in one designated plane where a distance between the upper structure and the building is shortest among the plurality of designated planes are displayed in a different mode from the occupation modes of the upper structure and the building in another designated plane.

3. The working plan assistance device according to claim 1, wherein
the circuitry is configured to cause the output interface to output the working plan assistance image in which the occupation modes of the upper structure and the building in one designated plane among the plurality of designated planes, the one designated plane being present at an end with respect to a direction in which the upper structure revolves, are displayed in a different mode from the occupation modes of the upper structure and the building in another designated plane.

4. The working plan assistance device according to claim 1, wherein
the circuitry is configured to cause the output interface to output the working plan assistance image in which the respective occupation modes of the upper structure and the building in each of the plurality of designated planes are displayed such that the upper structure in each of the plurality of designated planes is superimposed.

5. The working plan assistance device according to claim 1, wherein
the circuitry is configured to cause the output interface to sequentially or simultaneously output a plurality of working plan assistance image groups in which the respective occupation modes of the upper structure and the building in each of the plurality of designated planes are displayed, the plurality of designated planes constituting each of a plurality of the designated plane groups, the plurality of the designated plane groups corresponding to a time series of a space occupation mode of the upper structure in the three-dimensional virtual space.

6. The working plan assistance device according to claim 1, wherein
the circuitry is configured to cause the output interface to output the working plan assistance image in which the respective occupation modes of the upper structure and the building in each of the plurality of designated planes are displayed together with the respective occupation modes of the upper structure and the building in the three-dimensional virtual space.

7. The working plan assistance device according to claim 6, wherein
the circuitry is configured to cause the output interface to output the working plan assistance image in which the respective occupation modes of the upper structure and the building in each of the plurality of designated planes are displayed as respective cross sections of the upper structure and the building which are divided by the designated plane in the three-dimensional virtual space.

8. The working plan assistance device according to claim 7, wherein
the circuitry is configured to cause the output interface to output the working plan assistance image in which a space occupation mode, in the three-dimensional virtual space, of a portion is represented, the portion being present in a displacement direction of the upper structure around the revolution axis line while the designated plane is set as a reference.

9. A working plan assistance method comprising:
causing, via a server and a terminal comprising circuitry, an output interface to output a working plan assistance image in which respective occupation modes of an upper structure of a crane and a modeled building in each of a plurality of designated planes spaced apart from each other are displayed, the plurality of designated planes constituting a designated plane group defined in a front-rear direction of the upper structure, the designated plane group being perpendicular to a width direction of an attachment of the crane, the attachment being configured to derrick relative to the upper structure, the upper structure being revolvable around a revolution axis line extending in a vertical direction to a lower structure in the crane which is modeled in a three-dimensional virtual space; and changing a posture of the designated plane group according to a revolution of the upper structure such that a precision of estimation of interference between the upper structure of the crane and the building is improved based on the respective occupation modes of the upper structure and the building in the plurality of designated planes.

\* \* \* \* \*